United States Patent

Tanno et al.

[11] Patent Number: 5,285,274
[45] Date of Patent: Feb. 8, 1994

[54] OPTICAL WAVEGUIDE RECORDING MEDIUM AND APPARATUS FOR PLAYING THE SAME

[75] Inventors: Naohiro Tanno, Yamagata; Teruo Toma; Kiyofumi Chikuma, both of Tsurugashima, all of Japan

[73] Assignee: Pioneer Electronic Corporation, Tokyo, Japan

[21] Appl. No.: 800,087

[22] Filed: Nov. 29, 1991

[30] Foreign Application Priority Data

Apr. 26, 1991 [JP] Japan .................................. 3-97649

[51] Int. Cl.$^5$ .......................... G02B 6/10; G11B 7/00; G01D 15/10
[52] U.S. Cl. ........................ 385/129; 385/37; 385/31; 385/130; 369/100; 369/109; 346/76 L
[58] Field of Search ..................... 385/10, 14, 37, 31, 385/129, 130, 131; 369/44.11, 44.12, 44.13, 44.14, 100, 109; 346/76 L

[56] References Cited

U.S. PATENT DOCUMENTS

| | | | |
|---|---|---|---|
| 4,758,062 | 7/1988 | Sunagawa et al. | 385/37 X |
| 4,779,259 | 10/1988 | Kono et al. | 369/112 |
| 4,861,128 | 8/1989 | Ishikawa et al. | 385/28 X |
| 4,978,187 | 12/1990 | Minemura et al. | 385/37 X |
| 5,105,403 | 4/1992 | Kando et al. | 385/37 X |
| 5,185,829 | 2/1993 | Yamada et al. | 385/37 |
| 5,200,939 | 4/1993 | Nishiwaki et al. | 369/44.12 |
| 5,204,516 | 4/1993 | Opheij | 385/37 X |
| 5,210,404 | 5/1993 | Cush et al. | 385/37 X |

FOREIGN PATENT DOCUMENTS

| | | | |
|---|---|---|---|
| 0446063 | 9/1991 | European Pat. Off. | 369/109 X |
| 2-210627 | 8/1990 | Japan | 385/129 X |

OTHER PUBLICATIONS

Patent Abstracts of Japan, unexamined applications, P field, vol. 14, No. 508, Nov. 7, 1990, p. 6 P 1128 (Kokai-No. 02-210 627).
Patent Abstracts of Japan, unexamined applications, P field, vol. 14, No. 508, Nov. 7, 1990, p. 6 P 1128 (Kokai-No. 02-210 626).

*Primary Examiner*—Brian Healy
*Attorney, Agent, or Firm*—Sughrue, Mion, Zinn, Macpeak & Seas

[57] ABSTRACT

An optical waveguide recording medium including an optical waveguide having a photocoupler for receiving a light beam, and a plurality of refractive index-discontinuous portions aligned on the optical waveguide. One of the refractive index-discontinuous portions includes a diffraction grating having grooves extending approximately perpendicular to the lengthwise direction of the optical waveguide at equal intervals which gradually become narrower or wider as the distance of that refractive index-discontinuous portion from the photocoupler increases. This recording medium ensures that information is recorded with high density. A playing apparatus for an optical waveguide recording medium includes a light emitting means for generating a light beam with a modulated wavelength, an irradiating means for guiding the light beam to the photocoupler, a photodetecting means for performing photoelectric conversion of the light beam to provide an electric output, and a light-receiving means for guiding reflected signal light, reflected for each wavelength at the refractive index-discontinuous portions, subjected to amplitude and phase modulations, and returning via the photocoupler, to a light-receiving section of the photodetecting means.

14 Claims, 5 Drawing Sheets

OPTICAL WAVEGUIDE RECORDING MEDIUM AND APPARATUS FOR PLAYING THE SAME

BACKGROUND OF THE INVENTION

1. Field of the Invention

The present invention relates to an optical recording medium, particularly to an optical waveguide recording medium, which has an optical waveguide provided with refractive index-discontinuous portion to guide a light beam thereon the produce reflection of the guided beam having different amplitudes and phase delays, and which is capable of permitting recorded information to be reproduced as a time-series signal waveform from part of the reflected light and to a playing apparatus therefore.

2. Description of the Related Art

Japanese Unexamined Patent Publication No. 2-210627 discloses such an optical waveguide recording medium and a playing apparatus therefore. Further, a playing apparatus for an optical waveguide recording medium has been proposed which has a Mechelson interferometer type optical heterodyne detecting optical system. This reproducing apparatus comprises a collimator lens for converting a radiated light beam from a light source into a flux of parallel light, a half mirror for causing divergence of a light beam to be guided on an optical waveguide recording medium, an objective lens for coupling one part of the divided light beam to the optical waveguide of the recording medium, a movable mirror for imparting a phase shift and a frequency shift to the other part of the divided light beam to provide reference light, and a photodetector for causing interference between the signal light reflected by and returning from refractive index-discontinuous portions formed on the optical waveguide and the reference light for heterodyne detection of the optical output.

Since this reproducing apparatus utilizes the movable mirror as a means to subject the divided light beam to phase shift and frequency modulation for heterodyne detection, the modulation frequency is limited, thus restricting the improvement of the information recording density. What is more, the presence of the mirror driving section stands in the way of achieving miniaturization of the reproducing optical system and improvement of its reliability.

SUMMARY OF THE INVENTION

It is therefore an object of the present invention to provide a high-recording density optical waveguide recording medium and a playing apparatus having a miniaturized reproducing optical system.

An optical waveguide recording medium according to the present invention comprises an optical waveguide having a photocoupler for receiving a light beam and a plurality of refractive index-discontinuous portions aligned on the optical waveguide, shapes and relative positions of the refractive index-discontinuous portions being variables of information to be recorded, each of the refractive index-discontinuous portions consisting of a diffraction grating having grooves extending approximately perpendicular to a lengthwise direction of the optical waveguide at equal intervals that gradually become narrower or wider as the distance of each of the refractive index-discontinuous portions from the photocoupler increases.

According to the present invention, there is provided a playing apparatus for reproducing recorded information from an optical waveguide recording medium provided with an optical waveguide having a photocoupler for guiding a light beam and a plurality of refractive index-discontinuous portions aligned on the optical waveguide, shapes and relative positions of the refractive index-discontinuous portions being variables of information to be recorded, each of the refractive index-discontinuous portions consisting of a diffraction grating having grooves extending approximately perpendicular to a lengthwise direction of the optical waveguide at equal intervals that gradually become narrower or wider as the distance of each of the refractive index-discontinuous portions from the photocoupler increases, which apparatus comprises:

a light emitting means for generating a light beam with a modulated wavelength or a light beam with a broadband wavelength;

an irradiating means for guiding the light beam to the photocoupler;

a photodetecting means for performing photoelectric conversion of the light beam to provide an electric output; and a light-receiving means for guiding reflected signal light, reflected for each wavelength at the refractive index-discontinuous portions, subjected to amplitude and phase modulations, and returning via the photocoupler, to a light-receiving section of the photodetecting means.

In the case of using the light beam of a broadband wavelength, the playing apparatus further comprises a frequency discriminating means, connected to the photodetecting means, for converting the electric output into an electric signal indicative of the information.

According to the present invention, the optical waveguide recording medium playing apparatus having a miniaturized reproducing optical system can be provided.

DETAILED DESCRIPTION OF THE PREFERRED EMBODIMENTS

Preferred embodiments of the present invention will now be described referring to the accompanying drawings.

Figure 1A:
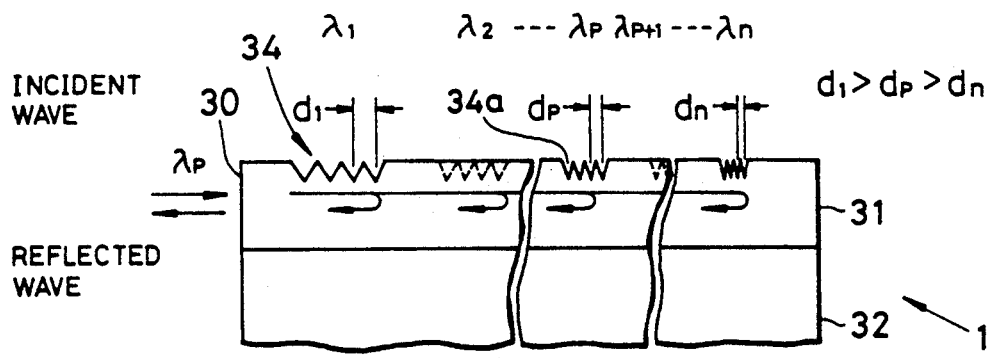
FIG. 1 A-C are schematic diagrams for explaining an optical waveguide recording medium according to the present invention.

FIG. 1 presents a diagram for explaining the principle of the present invention. In FIG. 1A, an optical waveguide recording medium 1 has such a structure that an optical waveguide of a core 31 where light is guided is formed on a substrate 32 as a cladding with a lower refractive index than that of the core. Air or another cladding exists on the upper interface of the core 31. The end surface of the core 31 serves as a photocoupler 30 which guides a light beam into the core. A plurality of refractive index-discontinuous portions 34 are provided and arranged on the upper interface of the inner surface of the core in the lengthwise direction thereof as recorded information. One of the refractive index-discontinuous portions 34 is a group of tiny recesses which, with respect to the incident light beam guided to enter the optical waveguide of the core 31, provide reflection of the guided light that has various 20 amplitudes and phases (i.e., signal light with modulated amplitudes and phases) in accordance with complex reflectances dependent on their relative positions from the photocoupler 30 at one end face and their shapes. In other words, one of the refractive index-discontinuous portions 34 consists of a diffraction grating having concave grooves 34a extending approximately perpendicular to the lengthwise direction of the optical waveguide 31 at equal intervals.

Figure 1B:
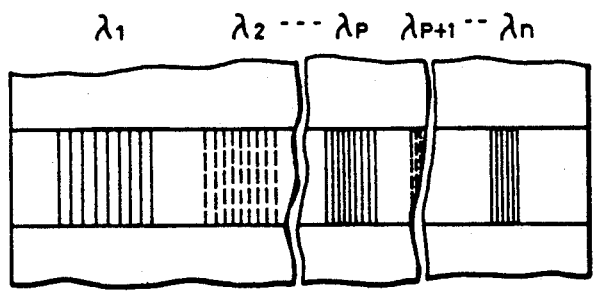

As shown in FIG. 1B, those refractive index-discontinuous portions 34 are provided in such a way that the intervals d between the grooves 34a gradually become narrower as the distance of each of the refractive index-discontinuous portions from the photocoupler 30 increases. The same effect can be attained if the refractive index-discontinuous portions 34 are provided in such a way that the intervals d between the grooves 34a gradually become wider with the increasing distance of each of the refractive-index discontinuous portions from the photocoupler 30. This arrangement will subject the light guided for reflection to frequency modulation. The refractive index-discontinuous portions 34 are recorded to have such shapes and positions as to have predetermined complex reflectances according to information to be recorded. The recesses of the refractive index-discontinuous portions 34 may take the form of embedded portions. If air or claddings whose refractive indices are smaller than that of the core are used as the embedded portions, the refractive index-discontinuous portions 34 are of, for example, semicircular or semielliptic embedded type and are several fractions to several times larger than the light wavelength. The core 31 is formed of, for example, a polycarbonate transparent to light, and the cladding formed of a polymer material, such as polymethyl methacrylate with a lower refractive index than that of polycarbonate.

Figure 2:
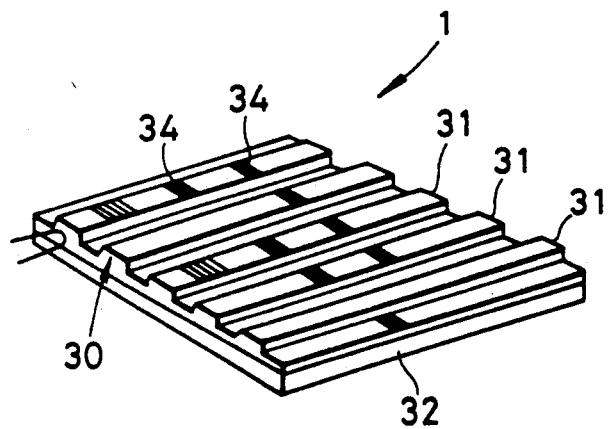
FIG. 2 is a perspective view of the optical waveguide recording medium of the present invention.

FIG. 2 specifically shows another type of optical waveguide recording medium 1. This recording medium 1 is designed in such a way that a plurality of channel type ridge waveguides 31 having the photocouplers 30 are arranged in parallel on the substrate 32, and a plurality of tiny refractive index-discontinuous portions 34 which provide reflection of guided light with different amplitudes and phases are provided in the core of the optical waveguide 31 in accordance with information to be recorded. Although the ridge waveguides are used for description in this embodiment, they may be of another channel type, such as a strip or embedded type. As long as the optical waveguides are of such types, if the refractive index-discontinuous portions 34 are formed on the core or the cladding for the optical waveguide, the same effect as attained by the ridge waveguide can be provided.

Figure 3:
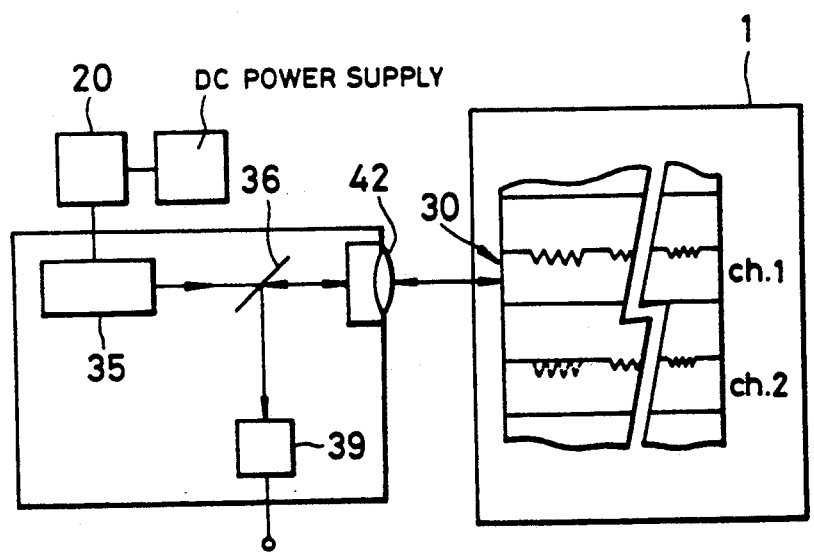
FIG. 3 is a schematic diagram illustrating a playing apparatus and an optical waveguide recording medium according to one embodiment of the present invention.

As shown in FIG. 3, the playing apparatus embodying the present invention employs a semiconductor laser 35, which is connected to a modulator 20 coupled to a DC power supply to modulate the drive current therefrom. This modulator 20 modulates the wavelength of the light beam emanating from the semiconductor laser 35. The playing apparatus further comprises an objective lens 42 as an irradiating means to guide the light beam to the photocoupler 30, a photodetector 39 as a photodetecting means to photoelectrically convert reflected signal light to provide an electric output, and a half mirror (beam splitter) 36 as a light-receiving means to guide the reflected signal light returning from the refractive index-discontinuous portion 34 to the light-receiving section of the photodetector 39.

Figure 1C:
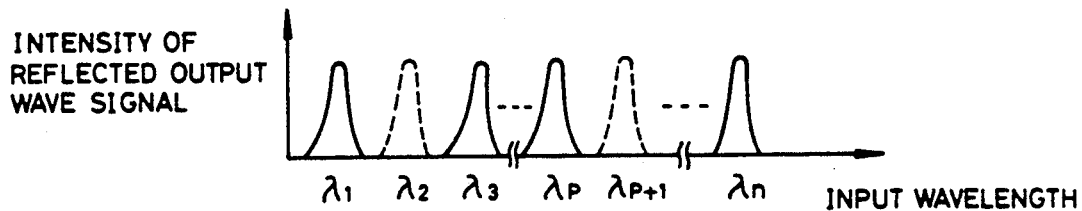

As illustrated in the fragmentary cross section along the boundary in FIG. 1A, the diffraction grating 34 is so configured that the intervals between its grooves a gradually become narrower along the lengthwise direction of the optical waveguide (31). As is apparent from FIG. 1A, when light is guided to travel away from the photocoupler end face, part of the guided light of a wavelength corresponding to the interval between adjoining grooves 34a undergoes the Bragg reflection to be reflected signal light, so that the reflected light may have its frequency and phase shifted. This shifted light will be signal light to return from the photocoupler 30. In the case as shown in FIG. 1A where a plurality of refractive index-discontinuous portions 34 are formed as information to be recorded at positions of $\lambda_1, \lambda_2, \ldots, \lambda_p, \ldots, \lambda_n$ with the intervals d between the grooves 34a satisfying $d = \lambda_p/2Ne$ where Ne denotes a refractive index of a guide mode, when the light beam from the semiconductor laser 35 having modulated wavelengths $\lambda_1, \lambda_2, \ldots, \lambda_p, \ldots, \lambda_n$ is guided to come in, electric outputs with a time-series signal waveform are attained in accordance with the information to be recorded at the positions $\lambda_2, \lambda_2, \ldots, \lambda_p, \ldots, \lambda_n$ of the refractive index-discontinuous portions 34, as shown in FIG. 1C.

Figure 4:
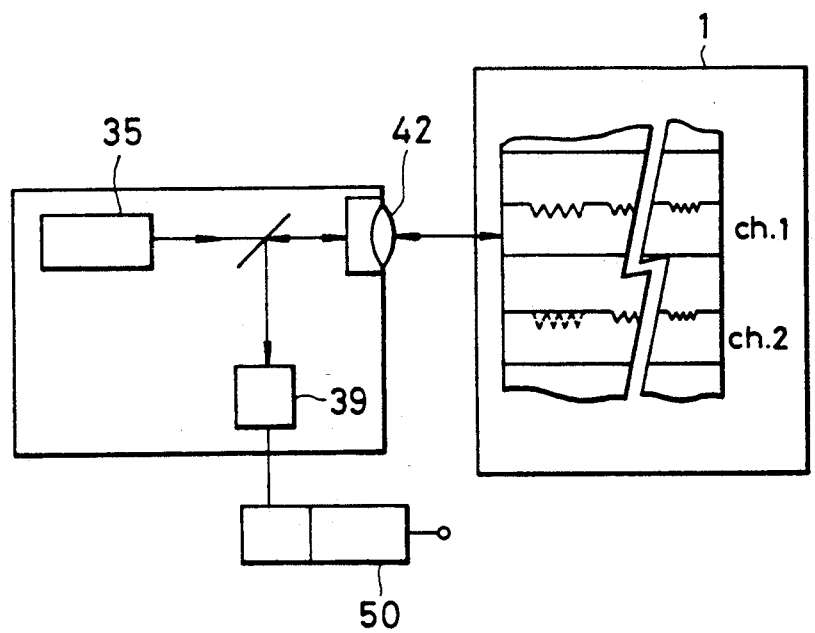
FIG. 4 is a schematic diagram illustrating a playing apparatus and an optical waveguide recording medium according to another embodiment of the present invention.

Although a light beam with a modulated wavelength for information reading is used according to this embodiment, a light emitting means such as a super luminescent diode (SLD) or the like which generates a light beam of a broadband wavelength may be used as a light source, with an additional provision of a scan type active filter 50 connected to the photodetector 39 to convert the electric output into an electric information signal as in another embodiment shown in FIG. 4 in order to produce the same effect as the first embodiment.

Figure 5:
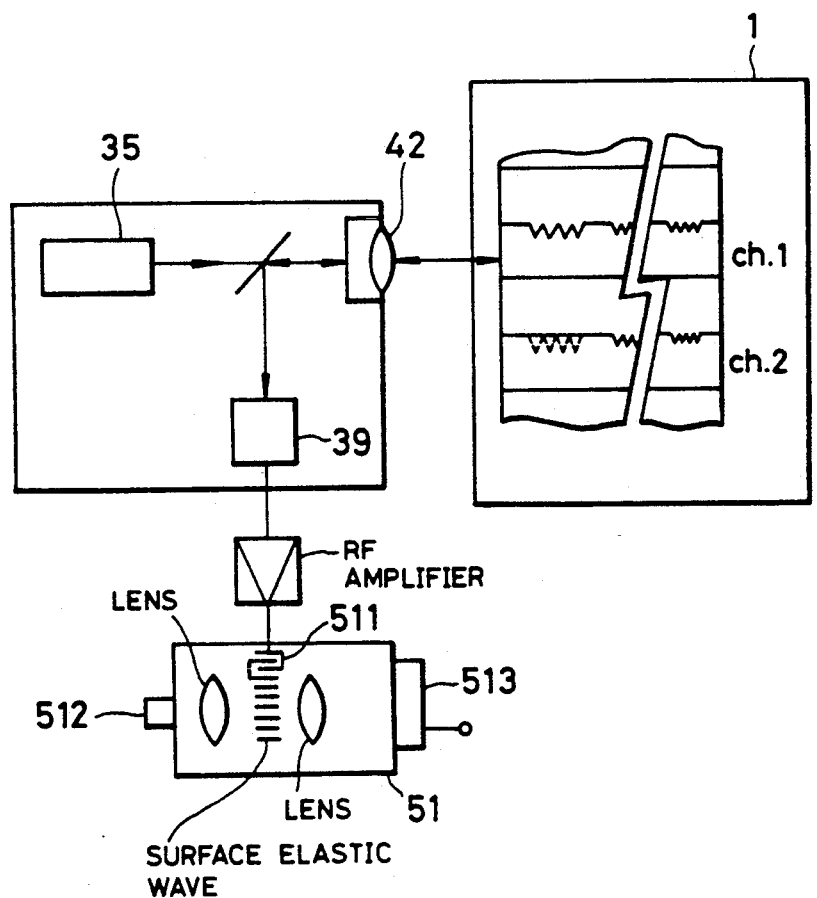
FIG. 5 is a schematic diagram illustrating a playing apparatus and an optical waveguide recording medium according to yet another embodiment of the present invention.

FIG. 5 illustrates a different embodiment using a light-accumulating spectrum analyzer as a frequency discriminating means. A beat signal component from the photodetector 39 is amplified by an RF amplifier. The electric output of the RF amplifier is applied to a transducer 511 of the spectrum analyzer 51 to excite the surface elastic wave corresponding to the beat signal component to diffract and separate the light from a semiconductor laser 512 by the surface elastic wave. Then the diffracted laser beam associated with the presence/absence of the beat frequency component undergoes photoelectric conversion in an optical array sensor 513. In this manner, the information recorded in the optical waveguide recording medium will be output as an electric signal for reproduction. This embodiment is characterized in that an arbitrary selection of the clock frequency of the optical array sensor can vary the frequency of a time-series reproduced signal.

Figure 6:
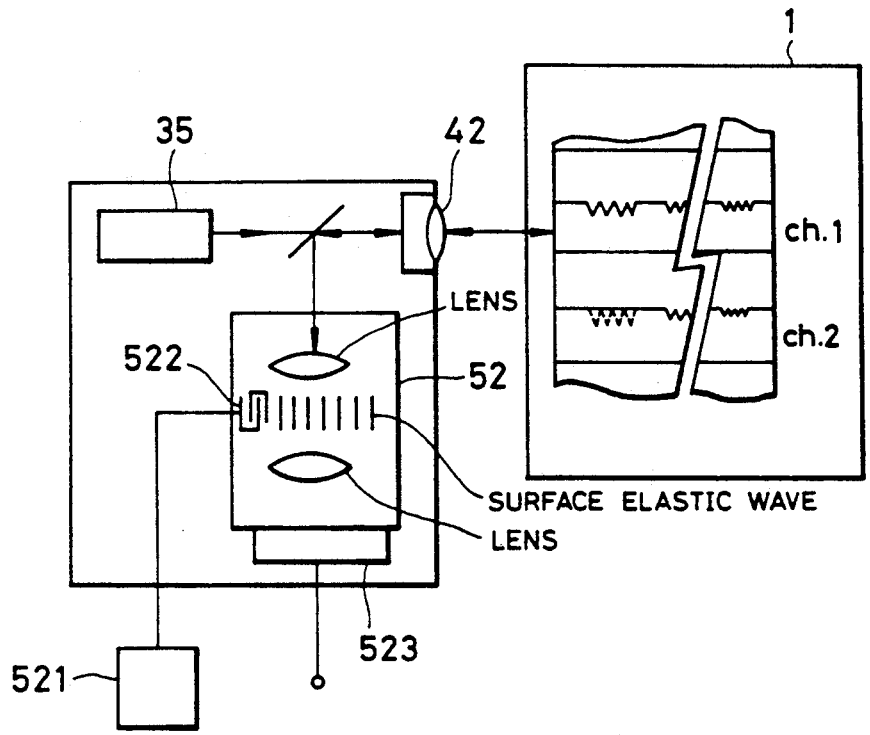
FIG. 6 is a schematic diagram illustrating a playing apparatus and an optical waveguide recording medium according to still another embodiment of the present invention.

FIG. 6 illustrates still another embodiment which is a light-accumulating reproducing apparatus having the light-receiving means and frequency discriminating means integrated by a light-accumulating spectrum analyzer. Reflected signal light from an optical waveguide recording medium is led to the light source section of a light-accumulating spectrum analyzer 52 of an external light-guiding type, and is applied to a transducer 522 with the electric output of an RF oscillator 521 to excite a surface elastic wave. The individual spectrum components of the reflected signal light are diffracted and separated by the surface elastic wave, and the components are photoelectrically converted by an optical array sensor 523. The output of this optical array sensor 523 is therefore the reproduced signal of the recorded information. The feature of this embodiment lies in that the number of elements is reduced to miniaturize the apparatus.

Figure 7:
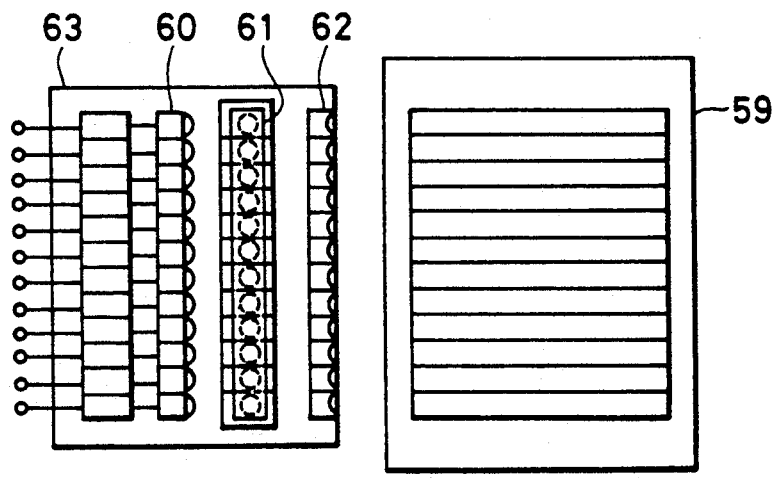
FIG. 7 is a schematic diagram illustrating a playing apparatus and an optical waveguide recording medium according to a still different embodiment of the present invention.
Figure 8:
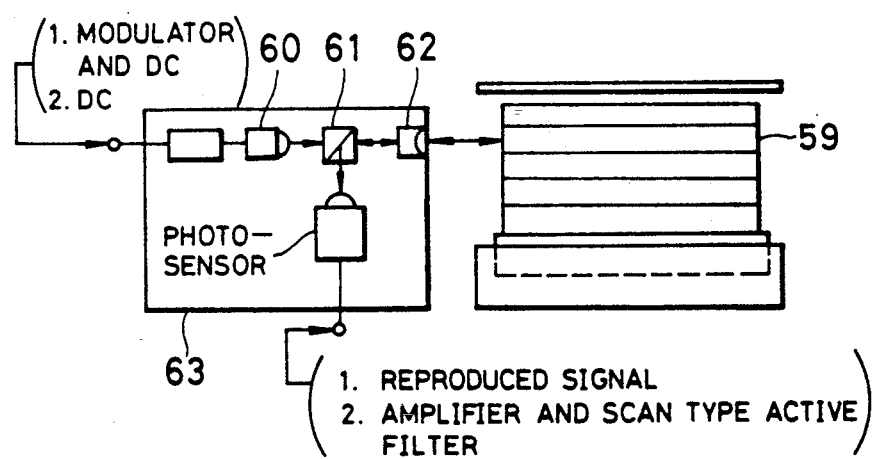
FIG. 8 is an elevation of FIG. 5.

The optical waveguide recording medium may be designed in such a manner that individual recording media are laminated side by side or one on another into a block 59 as shown in FIGS. 7 and 8. In this case a playing apparatus to be used employs a movable head 63 which has a row of laser diodes 60, a row of cube half mirrors 61 and a row of lenses 63 are arranged two-dimensionally, with the associated ones of such elements aligned on the common optical axis.

According to the present invention, as described above, one of the refractive index-discontinuous portions consists of a diffraction grating having grooves extending approximately perpendicular to the lengthwise direction of the optical waveguide at equal intervals which gradually become narrower or wider as the distance of that refractive-index discontinuous portion from the photocoupler increases. This design can miniaturize the reproducing optical system of the playing apparatus.

What is claimed is:

1. An optical waveguide recording medium comprising:
   an optical waveguide comprising a photocoupler for receiving a light beam; and
   a plurality of refractive index-discontinuous portions aligned on the optical waveguide, each portion having shapes and relative positions corresponding to the information to be recorded, at least one of the refractive index-discontinuous portions comprising a diffraction grating having one or more sets of grooves extending approximately perpendicular to a lengthwise direction of the optical waveguide, wherein the grooves of each set are spaced at equal intervals, and the intervals for each set gradually become narrower or wider as a distance of that set from the photocoupler increases.

2. A reproducing apparatus for reproducing recorded information from an optical waveguide recording medium provided with an optical waveguide comprising a photocoupler for guiding a light beam and a plurality of refractive index-discontinuous portions aligned on the optical waveguide, each portion having shapes and relative positions corresponding to the information to be recorded, at least one of the refractive index-discontinuous portions comprising a diffraction grating having one or more sets of grooves extending approximately perpendicular to a lengthwise direction of the optical waveguide, wherein the grooves of each set are at equal intervals, and the intervals for each set gradually become narrower or wider as a distance of that set from the photocoupler increases, the apparatus comprising:
   a light emitting means for generating a light beam with a modulated wavelength;
   an irradiating means for guiding the light beam to the photocoupler;
   a photodetecting means including a light-receiving section for photoelectrically converting the light beam and outputting an electric signal corresponding thereto; and
   a light-receiving means including means for guiding a reflected signal light, which is reflected for each wavelength at the refractive index-discontinuous portions, and which is subjected to amplitude and phase modulations, and means for returning the guided reflected signal via the photocoupler, to said light-receiving section of the photodetecting means.

3. A reproducing apparatus according to claim 2, wherein the light emitting means comprises a semiconductor laser for generating a laser beam subjected to current wavelength modulation.

4. A reproducing apparatus according to claim 2, wherein the irradiating means comprises an objective lens.

5. A reproducing apparatus according to claim 2, wherein the light-receiving means comprises a half mirror or a beam splitter.

6. A reproducing apparatus according to claim 2, wherein the photodetecting means comprises a photodetector.

7. A reproducing apparatus for reproducing recorded information from an optical waveguide recording medium comprising an optical waveguide having a photocoupler for guiding a light beam and a plurality of refractive index-discontinuous portions aligned on the optical waveguide, wherein shapes and relative positions of the refractive index-discontinuous portions correspond to the information to be recorded, at least one of the refractive index-discontinuous portions comprising a diffraction grating having one or more sets of grooves extending approximately perpendicular to a lengthwise direction of the optical waveguide, wherein the grooves of each set are at equal intervals and the intervals of each set gradually becomes narrower or wider as a distance of that set from the photocoupler increases, the apparatus comprising:
   a light emitting means for generating a light beam with a broadband wavelength;
   an irradiating means for guiding the light beam to the photocoupler;
   a photodetecting means including a light-receiving circuit for photoelectrically converting the light beam and for outputting an electric signal corresponding thereto;
   a light-receiving means including means for guiding reflected signal light, which is reflected for each wavelength at the refractive index-discontinuous portions, and which is subjected to amplitude and phase modulations, and means for returning the guided reflected signal via the photocoupler, to said light-receiving circuit of the photodetecting means; and a frequency discriminating means, connected to the photodetecting means, for converting the electric signal into a signal indicative of the information.

8. A reproducing apparatus according to claim 7, wherein the light emitting means comprises a super luminescent diode.

9. A reproducing apparatus according to claim 7, wherein the irradiating means comprises an objective lens.

10. A reproducing apparatus according to claim 7, wherein the light-receiving means comprises a half mirror or a beam splitter.

11. A reproducing apparatus according to claim 7, wherein the photodetecting means comprises a photodetector.

12. A reproducing apparatus according to claim 7, wherein the frequency discriminating means comprises a scan type active filter.

13. A reproducing apparatus according to claim 7, wherein the frequency discriminating means comprises a light-accumulating spectrum analyzer.

14. A reproducing apparatus according to claim 7, wherein the light-receiving means and the frequency discriminating means each have a light-accumulating spectrum analyzer.

* * * * *